US008947274B2

(12) United States Patent
Shibata

(10) Patent No.: US 8,947,274 B2
(45) Date of Patent: Feb. 3, 2015

(54) ENCODING APPARATUS, DECODING APPARATUS, ENCODING METHOD, ENCODING PROGRAM, DECODING METHOD, AND DECODING PROGRAM

(75) Inventor: Hideya Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/355,772

(22) PCT Filed: Jun. 21, 2012

(86) PCT No.: PCT/JP2012/065918
§ 371 (c)(1),
(2), (4) Date: May 1, 2014

(87) PCT Pub. No.: WO2013/190690
PCT Pub. Date: Dec. 27, 2013

(65) Prior Publication Data
US 2014/0313064 A1    Oct. 23, 2014

(51) Int. Cl.
*H03M 7/30* (2006.01)
(52) U.S. Cl.
CPC .................................. *H03M 7/3059* (2013.01)
USPC ................... 341/87; 341/51; 341/65; 341/67; 341/94; 341/107
(58) Field of Classification Search
USPC .................... 341/51, 65, 67, 87, 94, 106, 107
See application file for complete search history.

(56) References Cited

U.S. PATENT DOCUMENTS 6,131,104 A * 10/2000 Oberman ...................... 708/204
6,349,284 B1 * 2/2002 Park et al. ..................... 704/500
(Continued)

FOREIGN PATENT DOCUMENTS

JP          62 295136      12/1987
JP           4 195421       7/1992
(Continued)

OTHER PUBLICATIONS

Xie, et al., "Fast Lossless Compression of Seismic Floating-Point Data", 2009 International Forum on Information Technology and Applications, vol. 1. pp. 235-238, (May 2009).
Sano, et al., "Segment-Parallel Predictor for FPGA-based Hardware Compressor and Decompressor of Floating-Point Data Streams to Enhance Memory I/O Bandwidth", 2010 Data Compression Conference, IEEE Computer Society, pp. 416-425, (2010).
(Continued)

*Primary Examiner* — Linh Nguyen
(74) *Attorney, Agent, or Firm* — Oblon, Spivak, McClelland, Maier & Neustadt, L.L.P.

(57) ABSTRACT

A data predicted value generating unit generates a predicted value (data predicted value) for original data intended to be encoded, based on a history of original data which is floating-point data. A data predicted value modifying unit adjusts a mantissa value of the data predicted value by aligning an exponent value of the data predicted value with an exponent value of the original data. A first residual generating unit generates a residual (first residual) between new original data and the data predicted value after being adjusted. A first residual predicted value generating unit generates a predicted value for the first residual (first residual predicted value), based on a history of first residuals. A second residual generating unit generates a residual (second residual) between the first residual and the first residual predicted value. A residual encoding unit generates encoded data by encoding the second residual.

13 Claims, 11 Drawing Sheets

(56) References Cited

U.S. PATENT DOCUMENTS

| | | | |
|---|---|---|---|
| 6,629,231 B1* | 9/2003 | Lohman | 712/1 |
| 7,161,507 B2* | 1/2007 | Tomic | 341/51 |
| 7,209,056 B2* | 4/2007 | Moriya et al. | 341/51 |
| 7,996,233 B2* | 8/2011 | Oshikiri | 704/500 |
| 8,311,353 B2* | 11/2012 | Strom et al. | 382/238 |
| 8,364,495 B2* | 1/2013 | Morii | 704/500 |
| 8,756,056 B2* | 6/2014 | Grill et al. | 704/230 |
| 2001/0051969 A1* | 12/2001 | Oberman et al. | 708/514 |
| 2008/0089438 A1* | 4/2008 | Harada et al. | 375/296 |
| 2008/0320065 A1 | 12/2008 | Kan | |
| 2010/0296746 A1 | 11/2010 | Strom et al. | |
| 2011/0026820 A1 | 2/2011 | Strom et al. | |
| 2011/0279293 A1 | 11/2011 | Deslandes | |
| 2012/0166510 A1* | 6/2012 | Chen et al. | 708/512 |
| 2013/0124589 A1 | 5/2013 | Deslandes | |

FOREIGN PATENT DOCUMENTS

| | | |
|---|---|---|
| JP | 9 69782 | 3/1997 |
| JP | 2005 18606 | 1/2005 |
| JP | 2011 512067 | 4/2011 |
| JP | 2011 514024 | 4/2011 |
| JP | 2011 175542 | 9/2011 |
| JP | 2011 238236 | 11/2011 |
| JP | 2012 113657 | 6/2012 |
| WO | 2007 096982 | 8/2007 |

OTHER PUBLICATIONS

International Search Report Issued Sep. 18, 2012 in PCT/JP12/065918 Filed Jun. 21, 202.

* cited by examiner

ENCODING APPARATUS, DECODING APPARATUS, ENCODING METHOD, ENCODING PROGRAM, DECODING METHOD, AND DECODING PROGRAM

TECHNICAL FIELD

The present invention relates, for example, to an encoding apparatus, a decoding apparatus, an encoding method, an encoding program, a decoding method, and a decoding program for encoding (compressing) or decoding data.

BACKGROUND ART

As an encoding method in lossless compression of a data series, a method as described below is used.

First, a predicted value is obtained for encoding target data (generation of a predicted value). Next, a residual between the predicted value and the encoding target data is obtained (generation of a residual). Then, a data series composed of the residual is encoded using an appropriate scheme to obtain encoded data (encoding of the residual).

When variable-length encoding, such as gamma encoding, is used in the encoding of the residual, it is often the case that by using an intermediate step of obtaining a residual, encoded data composed of a smaller value (a value close to 0) compared to encoding target data can be obtained and a compression effect is thus enhanced through variable-length encoding.

However, if a residual is obtained for floating-point data (encoding target data) by simple floating-point calculations, an error is generated due to a loss of information. For this reason, lossless compression cannot be performed.

To avoid a loss of information, it is possible to obtain a residual by simple integer calculations by regarding floating-point data as integer data. However, this method ignores the data structure of floating-point data, so that an appropriate residual may not be obtained.

To solve such a problem, Patent Literature 1 discloses a method in which floating-point data (a sign part, an exponent part, and a mantissa part) is separated into a first portion composed of the exponent part and a second portion composed of the sign part and the mantissa part, and a residual is obtained by regarding each portion as integer data.

A method for obtaining a residual by regarding the sign part, the exponent part, and the mantissa part as separate integer data as described above is also disclosed in other literature (for example, Patent Literature 2) and can be said to be widely used.

However, if a value of the exponent part of encoding target data is different from a value of the exponent part of a predicted value, a value represented by the mantissa part of the encoding target data and a value represented by the mantissa part of the predicted value have different numbers of digits. For this reason, if a residual between the mantissa parts is obtained by the method disclosed in Patent Literature 1 or the like, a meaningful value cannot be obtained as the residual between the mantissa parts. This may cause a reduced compression rate.

For example, assume that the encoding target data is "1.23×10^4" (the mantissa part is "1.23" and the exponent part is "4") and that the predicted value is "9.98×10^3" (the mantissa part is "9.98" and the exponent part is "3").

In this case, the ones place value "1" of the mantissa part "1.23" of the encoding target data denotes the ten-thousands place value "10000" in decimal notation. The ones place value "9" of the mantissa part "9.98" of the predicted value denotes the thousands place value "9000" in decimal notation.

That is, the mantissa value "1.23" of the encoding target data and the mantissa value "9.98" of the predicted value have different numbers of digits. Thus, comparison of these mantissa parts has no meaning in floating-point terms, and no meaningful value can be obtained as a residual between these mantissa parts by comparing the mantissa parts.

CITATION LIST

Patent Literature

[Patent Literature]
Patent Literature 1: JP 2011-175542 A
Patent Literature 2: JP 2011-238236 A
Patent Literature 3: JP2005-018606 A

SUMMARY OF INVENTION

Technical Problem

It is an object of the present invention, for example, to perform lossless compression (encoding) of a data value without reducing a compression rate even if an exponent value of a floating-point data value (data value intended to be losslessly compressed) is different from an exponent value of a predicted value used for encoding.

Solution to Problem

An encoding apparatus according to the present invention includes a data value storage unit configured to store a data value, the data value being a floating-point value represented using an exponent value and a mantissa value, and being a value intended to be encoded;

a data related value storage unit configured to store a data related value, the data related value being a floating-point value used for encoding the data value stored in the data value storage unit;

an adjusted mantissa value generating unit configured to generate an adjusted mantissa value by adjusting a mantissa value of the data related value based on a difference between an exponent value of the data related value stored in the data related value storage unit and the exponent value of the data value stored in the data value storage unit;

an encoding target value generating unit configured to generate a specific exponent value based on the exponent value of the data value stored in the data value storage unit, generate a specific mantissa value based on the mantissa value of the data value and the adjusted mantissa value generated by the adjusted mantissa value generating unit, and generate an encoding target value based on the specific exponent value and the specific mantissa value, the encoding target value being a floating-point value and being a value to be encoded; and a data encoded value generating unit configured to generate a data encoded value by encoding the encoding target value generated by the encoding target value generating unit.

Advantageous Effects of Invention

According to the present invention, for example, a data value can be losslessly compressed (encoded) without reducing a compression rate even if an exponent value of a floating-point data value is different from an exponent value of a predicted value (data related value) used for encoding.

DESCRIPTION OF EMBODIMENTS

First Embodiment

An embodiment of a data compression apparatus that is configured to compress (encode) and decode a floating-point data value will be described.

Figure 1:
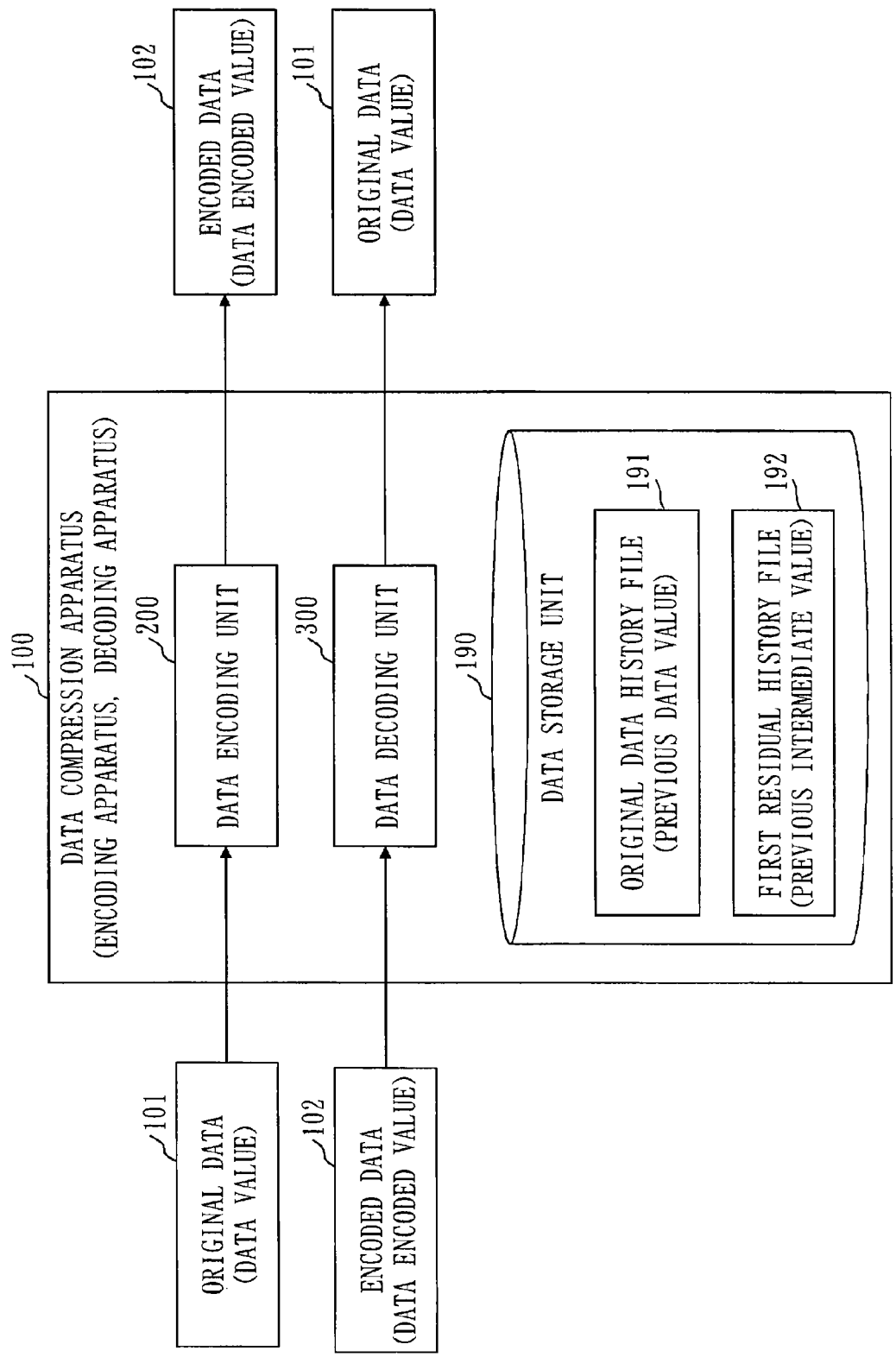
FIG. 1 is a functional configuration diagram of a data compression apparatus 100 according to a first embodiment.

FIG. 1 is a functional configuration diagram of a data compression apparatus 100 according to a first embodiment.

Referring to FIG. 1, a functional configuration of the data compression apparatus 100 according to the first embodiment will be described.

The data compression apparatus 100 (an example of an encoding apparatus and a decoding apparatus) includes a data encoding unit 200, a data decoding unit 300, and a data storage unit 190.

The data encoding unit 200 is configured to input data intended to be encoded (an example of a data value) (hereinafter referred to as "original data 101").

The data encoding unit 200 is configured to generate data representing encoded original data 101 (an example of an encoded data value) (hereinafter referred to as "encoded data 102").

The data encoding unit 200 is configured to output the generated encoded data 102.

The data encoding unit 200 will be described in detail later.

The data decoding unit 300 is configured to input the encoded data 102, decode the original data 101 using the encoded data 102 that has been input, and output the original data 101.

The data decoding unit 300 will be described in detail later.

The data storage unit 190 (an example of a data value storage unit, a data related value storage unit, an intermediate related value storage unit, a previous intermediate value storage unit, a previous data value storage unit, and a data encoded value storage unit) is configured to store data used in the data compression apparatus 100.

For example, the data storage unit 190 stores the original data 101, the encoded data 102, an original data history file 191, and a first residual history file 192.

The original data history file 191 is a file including one or more pieces of previously encoded original data 101 (a history of original data 101) (an example of previous data values). Note that a history of some pieces of original data 101 may be stored in a memory instead of being arranged as a file.

The first residual history file 192 is a file including a previously generated first residual (a history of first residuals) (an example of a previous intermediate value). Note that a history of some first residuals may be stored in a memory instead of being arranged as a file. The first residual will be described in detail later.

Figure 2:
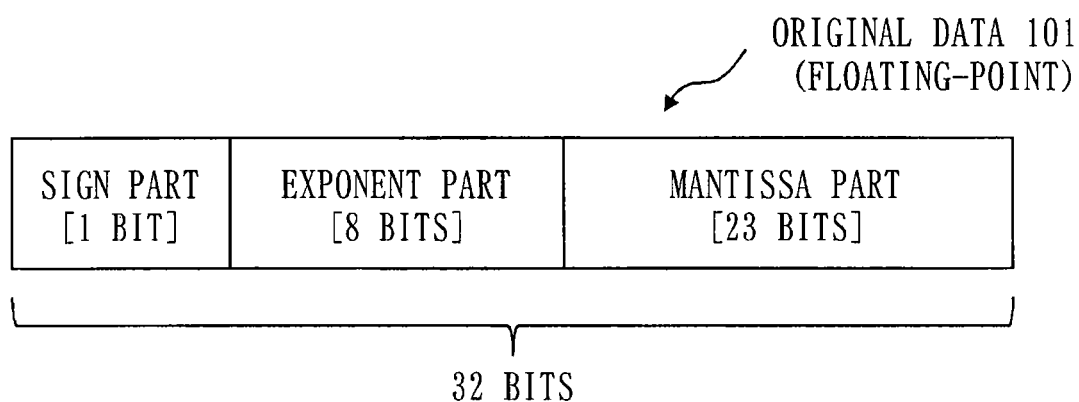
FIG. 2 is a diagram illustrating an example of a data structure of original data 101 according to the first embodiment.

FIG. 2 is a diagram illustrating an example of a data structure of the original data 101 according to the first embodiment.

Referring to FIG. 2, the data structure of the original data 101 according to the first embodiment will be described.

The original data 101 is a floating-point value that is represented using a sign part, an exponent part, and a mantissa part. Various data values that are used to compress (encode) or decode the original data 101 are also floating-point values.

In the first embodiment, it is assumed that the original data 101 and the various data values are single-precision floating-point values represented in IEEE 754 format (an example of a floating-point format) as shown in FIG. 2 or in a format equivalent to this format. Note that the original data 101 and the various data values may be floating-point values represented in other formats.

A single-precision floating-point value represented in IEEE 754 format is represented using a total of 32 bits composed of a 1-bit sign part, an 8-bit exponent part, and a 23-bit mantissa part.

Hereinafter, a value of the sign part (plus or minus) will be called a "sign value", a value of the exponent part will be called an "exponent value", and a value of the mantissa part will be called a "mantissa value".

For example, in the case of a data value "$-1.23 \times 10^4$ (=−12300)" in decimal format, the sign value is "−", the exponent value is "4", and the mantissa value is "1.23".

Figure 3:
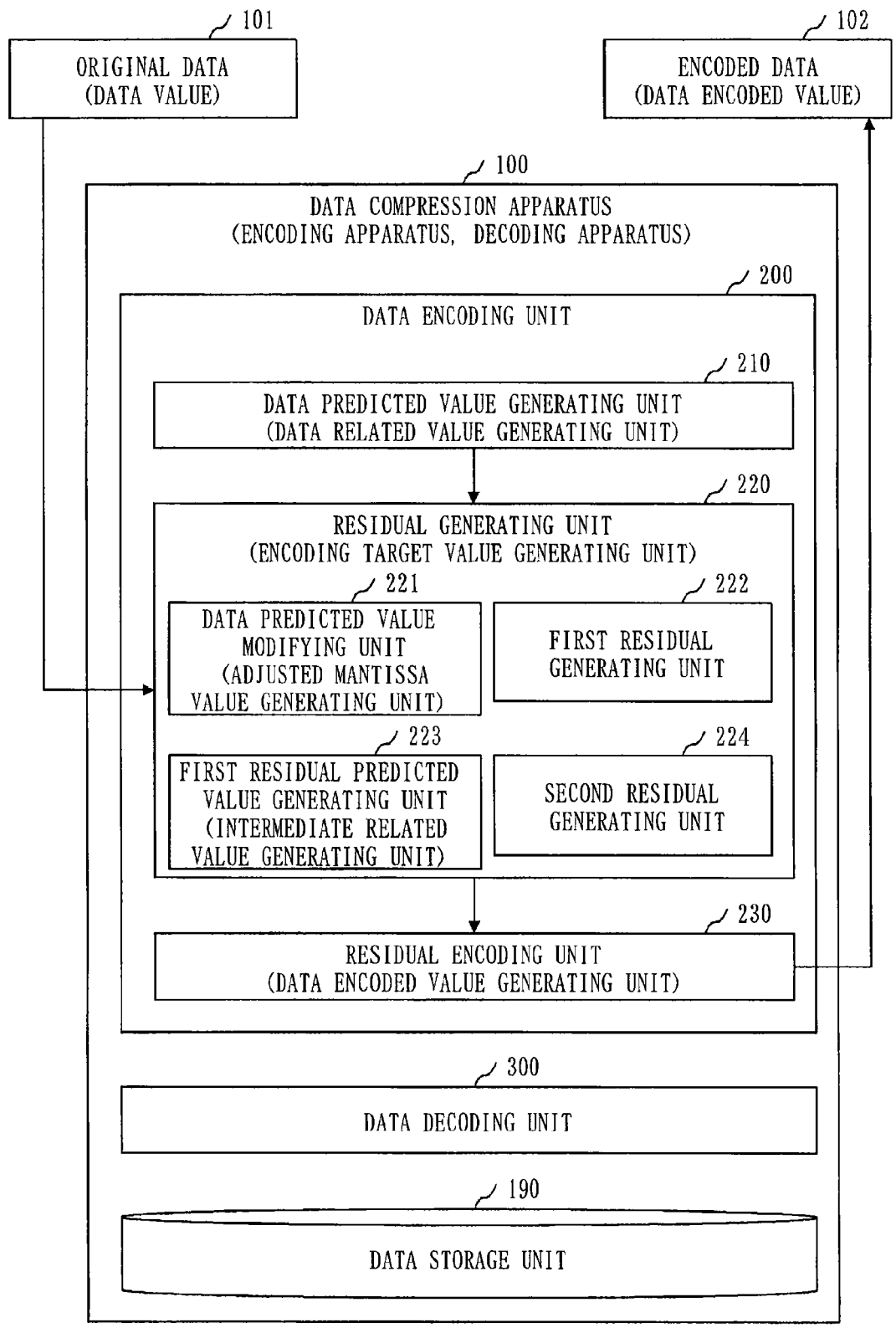
FIG. 3 is a diagram illustrating a functional configuration of a data encoding unit 200 according to the first embodiment.

FIG. 3 is a diagram illustrating a functional configuration of the data encoding unit 200 according to the first embodiment.

Referring to FIG. 3, the functional configuration of the data encoding unit 200 according to the first embodiment will be described.

The data encoding unit 200 includes a data predicted value generating unit 210, a residual generating unit 220, and a residual encoding unit 230.

The data predicted value generating unit 210 (an example of a data related value generating unit) is configured to generate a data predicted value based on the original data history file 191 (not illustrated) that is pre-stored in the data storage unit 190. The data predicted value (an example of a data related value) is a value for predicting (decoding) the original data 101.

The data predicted value generating unit 210 will be described in detail later.

The residual generating unit 220 (an example of an encoding target value generating unit) is configured to generate a second residual (an example of an encoding target value) based on the original data 101 and the data predicted value generated by the data predicted value generating unit 210.

The residual generating unit 220 includes a data predicted value modifying unit 221, a first residual generating unit 222, a first residual predicted value generating unit 223, and a second residual generating unit 224.

The data predicted value modifying unit 221 (an example of an adjusted mantissa value generating unit) is configured to modify the data predicted value based on a difference between an exponent value of the original data 101 and an exponent value of the data predicted value.

The first residual generating unit 222 is configured to generate a residual (hereinafter referred to as a "first residual") between the original data 101 and the modified data predicted value.

The first residual predicted value generating unit 223 (an example of an intermediate related value generating unit) is configured to generate a first residual predicted value based on the first residual history file 192 (not illustrated) that is pre-stored in the data storage unit 190. The first residual predicted value (an example of an intermediate related value) is a value for predicting (decoding) the first residual.

The second residual generating unit 224 is configured to generate a residual (hereinafter referred to as a "second residual") between the first residual and the first residual predicted value.

Functional configurations of the units included in the residual generating unit 220 will be described in detail later.

The residual encoding unit 230 (an example of a data encoded value generating unit) is configured to encode the second residual generated by the second residual generating unit 224 of the residual generating unit 220. This generates encoded data 102 representing the encoded original data 101.

The residual encoding unit 230 will be described in detail later.

Figure 4:
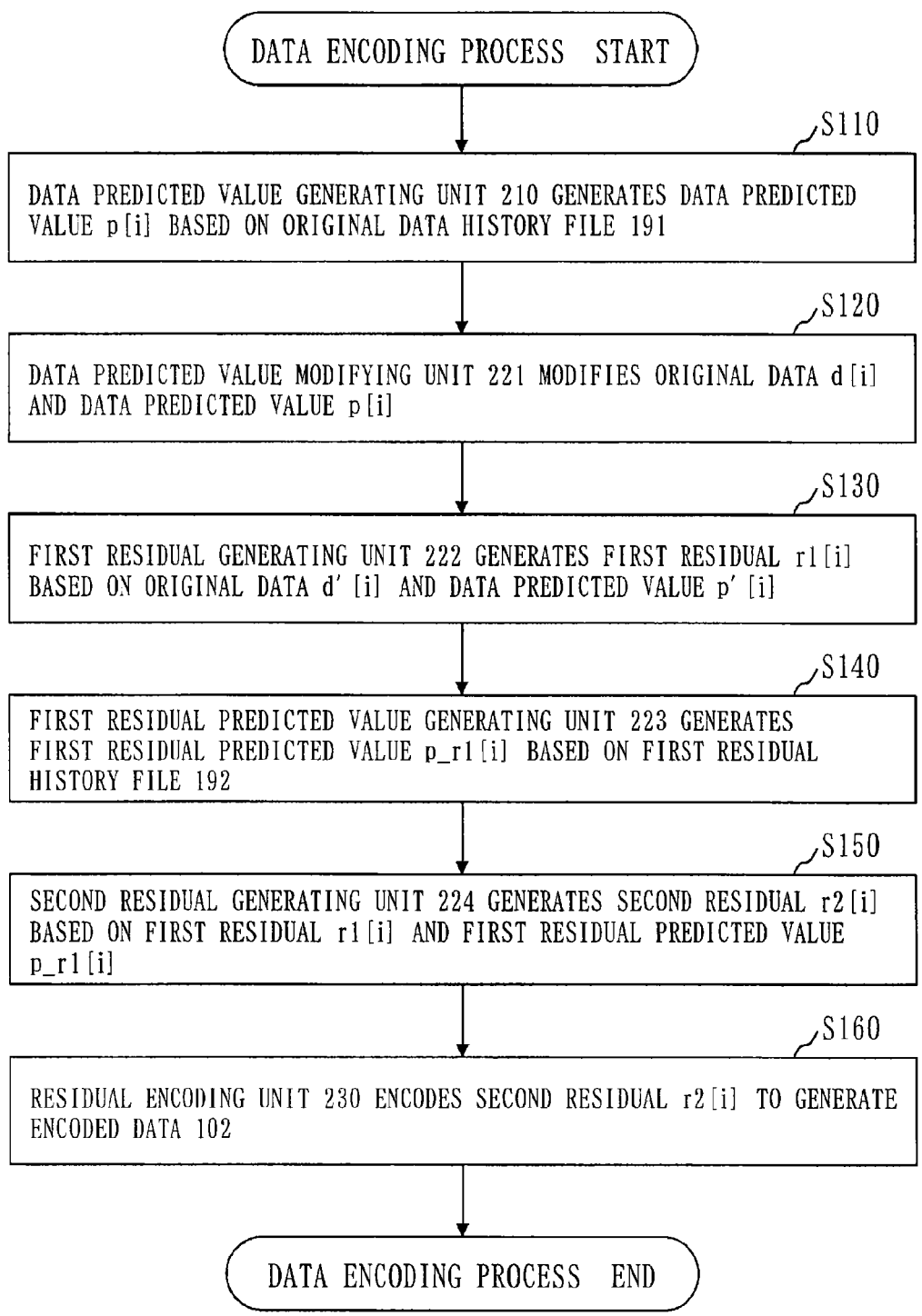
FIG. 4 is a flowchart illustrating a data encoding process of the data encoding unit 200 according to the first embodiment.

FIG. 4 is a flowchart illustrating a data encoding process of the data encoding unit 200 according to the first embodiment.

Referring to FIG. 4, the data encoding process (an example of an encoding method) of the data encoding unit 200 according to the first embodiment will be described.

In S110, the data predicted value generating unit 210 generates a data predicted value based on the original data history file 191. The data predicted value is a floating-point value having the same data structure as the original data 101.

Hereinafter, an i-th (i being an integer of 1 or more) piece of the original data 101 will be described as d[i], and a data predicted value of the original data d[i] will be described as p[i].

For example, the data predicted value generating unit 210 obtains previously encoded original data d[i−1] from the original data history file 191, and sets the obtained original data d[i−1] in a variable of the data predicted value p[i]. That is, p[i]=d[i−1]. Note that d[0] is a predetermined constant.

Note that the data predicted value generating unit 210 may generate the data predicted value p[i] using a value other than the original data d[i−1]. For example, the data predicted value generating unit 210 may use previous-but-one original data d[i−2] as the data predicted value p[i]. Alternatively, the data predicted value generating unit 210 may perform linear prediction on the pieces of original data included in the original data history file 191, and use a linear predicted value (a weighted sum of the pieces of original data) as the data predicted value p[i]. Alternatively, the data predicted value generating unit 210 may generate the data predicted value p[i] without using any previous original data 101. For example, a predetermined data predicted value p[i] may be pre-stored in the data storage unit 190.

After S110, processing proceeds to S120.

In S120, the data predicted value modifying unit 221 inputs the original data d[i] and the data predicted value p[i], and modifies the original data d[i] and the data predicted value p[i] that have been input.

The term "input" means to obtain data from the data storage unit 190 or an input device of the data compression apparatus 100.

Figure 5:
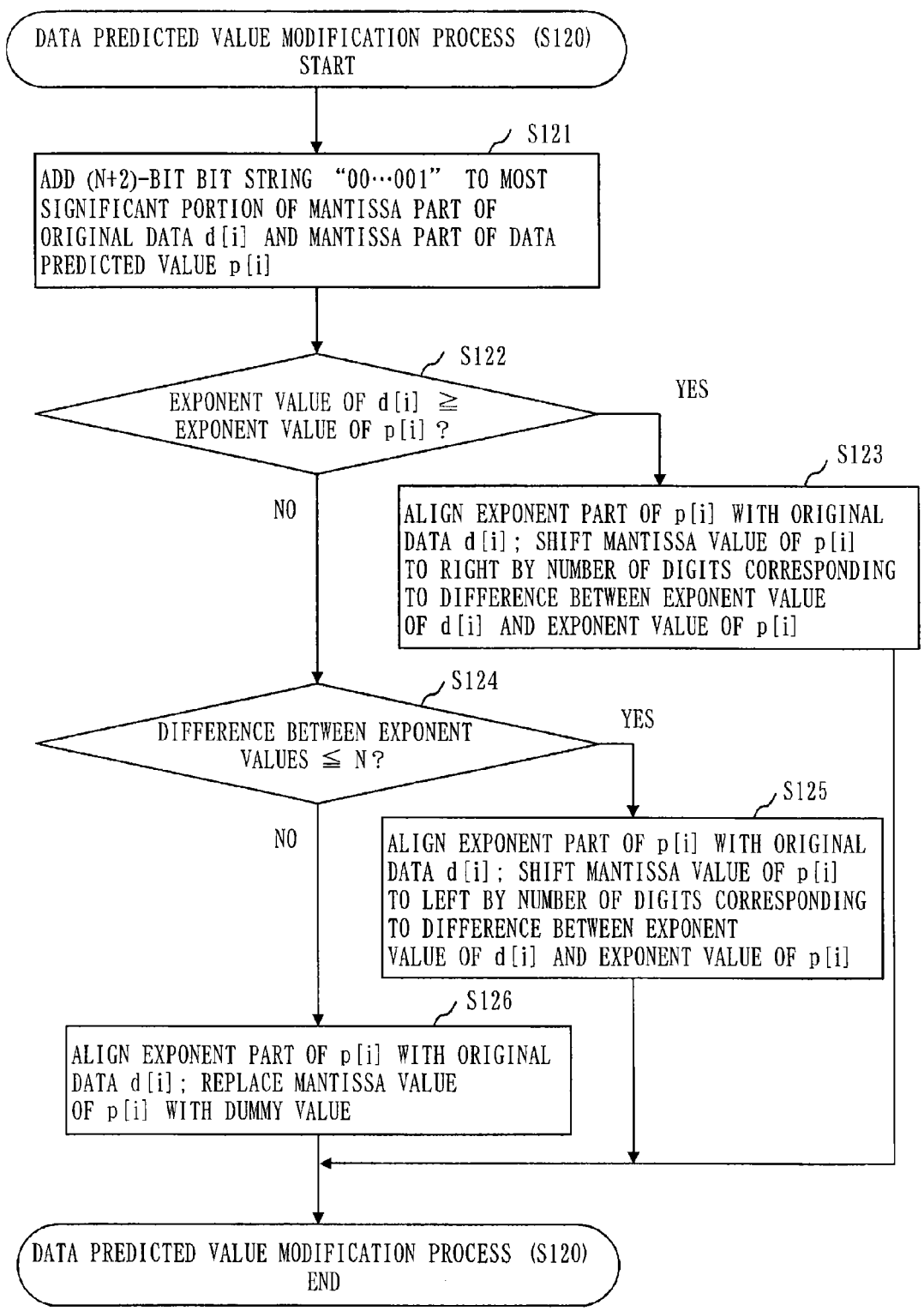
FIG. 5 is a flowchart illustrating a data predicted value modification process (S120) according to the first embodiment.

FIG. 5 is a flowchart illustrating a data predicted value modification process (S120) according to the first embodiment.

Referring to FIG. 5, the data predicted value modification process (S120) according to the first embodiment will be described.

In S121, the data predicted value modifying unit 221 adds an (N+2)-bit bit string "00 . . . 001" ((N+1) consecutive bit values 0 followed by one bit value 1) to the most significant portion of each of the mantissa part of the original data d[i] and the mantissa part of the data predicted value p[i]. The parameter N is a predetermined integer.

For example, if the mantissa part of the original data d[i] is "100 . . . 00", the mantissa part of the original data d[i] after the bit string "00 . . . 001" has been added is "00 . . . 001100 . . . 00".

The last bit "1" of the bit string to be added corresponds to the hidden bit of a floating-point number in IEEE 754 format. That is, when a floating-point format without the hidden bit "1" is used, the data predicted value modifying unit 221 may add a bit string "00 . . . 00" of (N+1) consecutive bit values "0" to the most significant portion of the mantissa part.

In subsequent processes, the data predicted value modifying unit 221 uses the original data d[i] and the data predicted value p[i] after the bit string has been added respectively.

After S121, processing proceeds to S122.

In S122, the data predicted value modifying unit 221 determines whether or not an exponent value of the original data d[i] is greater than or equal to an exponent value of the data predicted value p[i].

If the exponent value of the original data d[i] is greater than or equal to the exponent value of the data predicted value p[i] (YES), processing proceeds to S123.

If the exponent value of the original data d[i] is less than the exponent value of the data predicted value p[i] (NO), processing proceeds to S124.

In S123, the data predicted value modifying unit 221 changes the exponent value of the data predicted value p[i] to the same value as the exponent value of the original data d[i]. If the exponent value of the data predicted value p[i] is the same as the exponent value of the original data d[i], the exponent value of the data predicted value p[i] remains unchanged.

Further, the data predicted value modifying unit 221 shifts a mantissa value of the data predicted value p[i] to the right within the mantissa part by the same number of bits as the number of digits corresponding to a difference between the exponent value of the original data d[i] and the exponent value of the data predicted value p[i] (hereinafter referred to as a "difference between the exponent values") (the least significant bit(s) shifted out of the mantissa part is/are discarded).

That is, the data predicted value modifying unit 221 changes the mantissa value of the data predicted value p[i] to a value which is smaller by the number of digits corresponding to the difference between the exponent values. If the difference between the exponent values is zero, the mantissa value of the data predicted value p[i] remains unchanged.

The least significant bit(s) shifted out of the mantissa part may be ignored. That is, information of the least significant bit(s) shifted out may be lost. This is because a loss of information of the data predicted value p[i] does not affect the reversibility of compression of the original data d[i].

For example, if the original data d[i] is "1.23×10^4" in decimal format and the data predicted value p[i] is "9.98× 10^3" in decimal format, the data predicted value modifying unit 221 changes the data predicted value p[i] to "0.99×10^4".

S123 completes the data predicted value modification process (S120).

In S124, the data predicted value modifying unit 221 determines whether or not the difference between the exponent values of the data predicted value p[i] and the original data d[i] is less than or equal to the parameter N.

If the difference between the exponent values is less than or equal to the parameter N (YES), processing proceeds to S125.

If the difference between the exponent values is greater than the parameter N (NO), processing proceeds to S126.

In S125, the data predicted value modifying unit 221 changes the exponent value of the data predicted value p[i] to the same value as the exponent value of the original data d[i].

Further, the data predicted value modifying unit 221 shifts the mantissa value of the data predicted value p[i] to the left within the mantissa part by the same number of bits as the number of digits corresponding to the difference between the exponent values of the original data d[i] and the data predicted value p[i] (the most significant bit(s) shifted out of the mantissa part is/are discarded).

That is, the data predicted value modifying unit 221 changes the mantissa value of the data predicted value p[i] to a value which is greater by the number of digits corresponding to the difference between the exponent values.

The most significant bit(s) shifted out of the mantissa part is/are the bit(s) of the bit string "00 ... 00" added in S121, and thus may be ignored. That is, information of the mantissa part of the data predicted value p[i] will not be lost even if the most significant bit(s) of the mantissa part of the data predicted value p[i] is/are discarded.

For example, if the original data d[i] is "9.98×10^3" in decimal format and the data predicted value p[i] is "1.23× 10^4" in decimal format, the data predicted value modifying unit 221 changes the data predicted value p[i] to "12.30× 10^3".

S125 completes the data predicted value modification process (S120).

In S126, the data predicted value modifying unit 221 changes the exponent value of the data predicted value p[i] to the same value as the exponent value of the original data d[i].

Further, the data predicted value modifying unit 221 sets a predetermined dummy value in the mantissa part of the data predicted value p[i].

That is, the data predicted value modifying unit 221 changes the mantissa value of the data predicted value p[i] to the same value as the predetermined dummy value.

Note that the number of bits of the dummy value is less than or equal to the number of bits of the mantissa part of the data predicted value p[i] after the bit string has been added in S121.

If the mantissa value of the data predicted value p[i] is shifted to the left as in S125, the most significant bit(s) of the mantissa value of the data predicted value p[i] will be discarded. Thus, there is a possibility that a relation between the mantissa value of the original data d[i] and the mantissa value of the data predicted value p[i] may be lost.

Therefore, the data predicted value modifying unit 221 sets the dummy value in the mantissa part of the data predicted value p[i] instead of using the data predicted value p[i].

The dummy value may be an arbitrary value. For example, the dummy value may be zero (bit values of all bits are 0).

Alternatively, the dummy value may be a median value of possible values of the mantissa value of the original data d[i] (after the bit string has been added in S121). This median value can be represented by a bit string "00 ... 0110 ... 00". When the dummy value which is the median value is used as the mantissa value of the data predicted value p[i], a difference between the mantissa values of the original data d[i] and the data predicted value p[i] is reduced. Thus, an effect of countering reduction of the compression rate can be expected. Patent Literature 3 also discloses a method for reducing a difference between data and a predicted value.

S126 completes the data predicted value modification process (S120).

In the data predicted value modification process (S120), the data predicted value modifying unit 221 modifies the data predicted value p[i] such that the exponent value of the data predicted value p[i] is aligned with the exponent value of the original data d[i].

At this time, the data predicted value modifying unit 221 arranges that no information of the original data d[i] is lost and that the number of bits increased by data modification does not exceed the predetermined constant value (N).

With this arrangement, meaningful comparison and calculation can be performed using the mantissa values of the modified data predicted value p[i] and the modified original data d[i].

The data predicted value p[i] is modified based on the exponent value of the original data d[i], so that the original data d[i] can be decoded from encoded data 102 that is generated using the modified data predicted value p[i]. A decoding process of the original data d[i] will be described later.

Referring back to FIG. 4, the data encoding process will be further described.

Hereinafter, the modified original data d[i] will be described as original data d'[i], and the modified data predicted value p[i] will be described as a data predicted value p'[i].

After S120, processing proceeds to S130.

In S130, the first residual generating unit 222 generates a residual between the original data d'[i] and the data predicted value p'[i]. A residual is a value that is generated based on a comparison result of comparing a plurality of values.

The first residual generating unit 222 calculates a residual between the sign values of the original data d'[i] and the data predicted value p'[i], and a residual between the mantissa values of the original data d'[i] and the data predicted value p'[i]. The first residual generating unit 222 uses the exponent value of the original data d'[i] without calculating a residual between the exponent values.

Hereinafter, the residual between the original data d'[i] and the data predicted value p'[i] will be described as a first residual r1[i]. The first residual r1[i] is a floating-point value having the same data structure as the original data d'[i] and the data predicted value p'[i].

Figure 6:
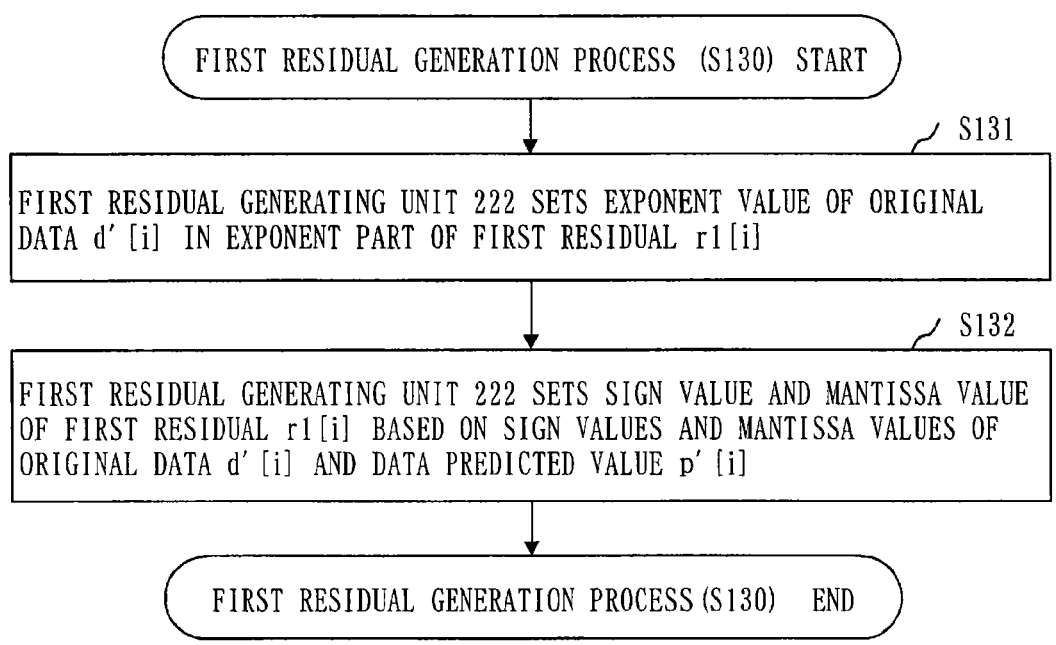
FIG. 6 is a flowchart illustrating a first residual generation process (S130) according to the first embodiment.

FIG. 6 is a flowchart illustrating a first residual generation process (S130) according to the first embodiment.

Referring to FIG. 6, the first residual generation process (S130) according to the first embodiment will be described.

In S131, the first residual generating unit 222 sets the exponent value of the original data d'[i] in the exponent part of the first residual r1[i].

Note that the first residual generating unit 222 may set a different value based on the exponent value of the original data d'[i] in the exponent part of the first residual r1[i]. For example, the first residual generating unit 222 may set a value obtained by subtracting a predetermined value from (or adding a predetermined value to) the exponent value of the original data d'[i] in the exponent part of the first residual r1[i].

By generating the exponent value of the first residual r1[i] based on the exponent value of the original data d'[i], the original data d[i] can be decoded from encoded data 102 that is generated using the first residual r1[i]. The decoding process of the original data d[i] will be described later.

After S131, processing proceeds to S132.

In S132, the first residual generating unit 222 sets the sign value and the mantissa value of the first residual r1[i] based on the sign values and the mantissa values of the original data d'[i] and the data predicted value p'[i].

An example of a sign value and mantissa value setting process (S132) will be described below.

S132 completes the first residual generation process (S130).

Figure 7:
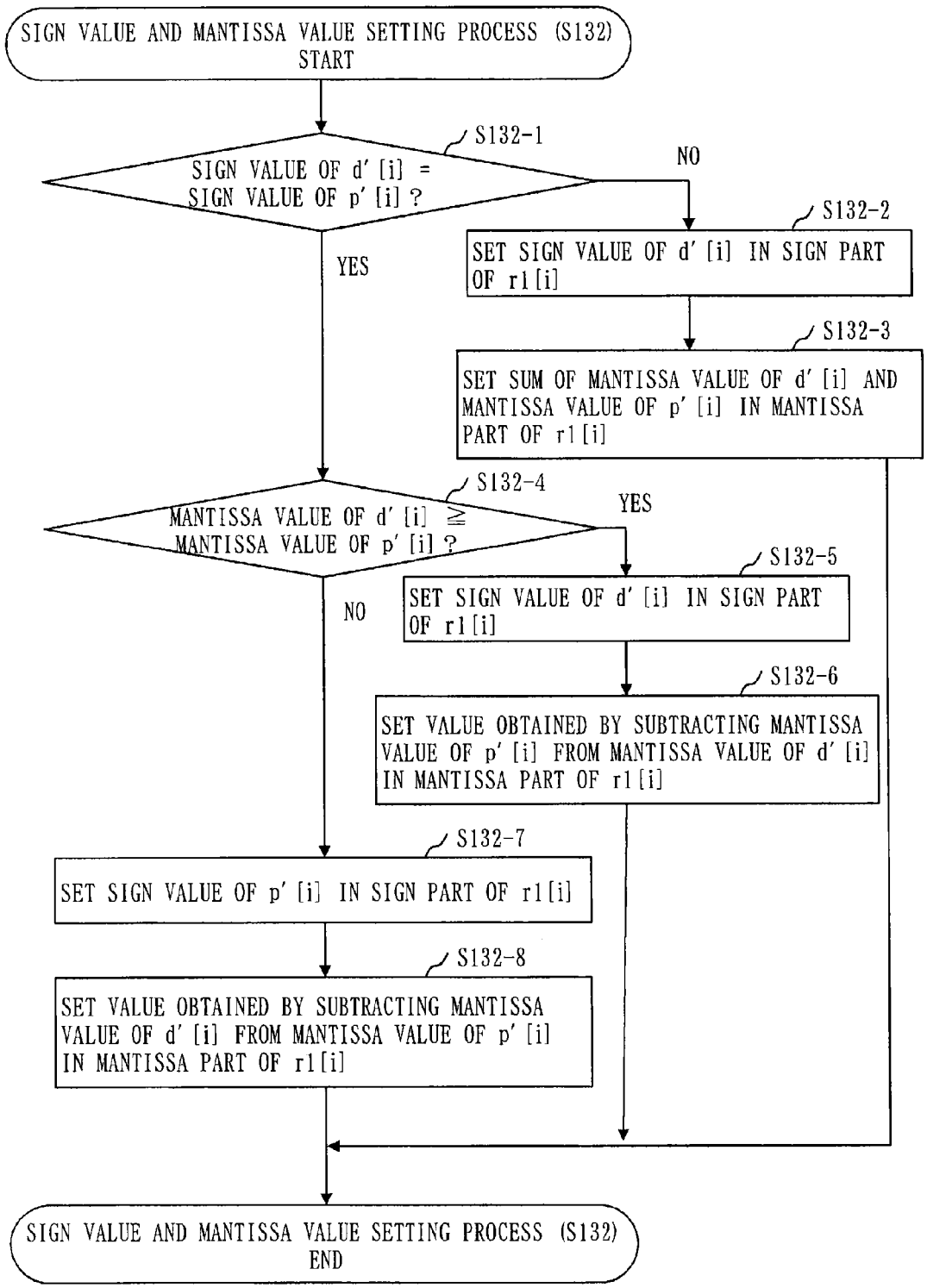
FIG. 7 is a flowchart illustrating an example of a sign value and mantissa value setting process (S132) according to the first embodiment.

FIG. 7 is a flowchart illustrating an example of the sign value and mantissa value setting process (S132) according to the first embodiment.

Referring to FIG. 7, an example of the sign value and mantissa value setting process (S132) according to the first embodiment will be described.

In S132-1, the first residual generating unit 222 determines whether or not the sign value of the original data d'[i] is the same as the sign value of the data predicted value p'[i].

If the sign value of the original data d'[i] is the same as the sign value of the data predicted value p'[i] (YES), processing proceeds to S132-4.

If the sign value of the original data d'[i] is different from the sign value of the data predicted value p'[i] (NO), processing proceeds to S132-2.

In S132-2, the first residual generating unit 222 sets the sign value of the original data d'[i] in the sign part of the first residual r1[i].

After S132-2, processing proceeds to S132-3.

In S132-3, the first residual generating unit 222 sets a sum of the mantissa value of the original data d'[i] and the mantissa value of the data predicted value p'[i] in the mantissa part of the first residual r1[i].

S132-3 completes the sign value and mantissa value setting process (S132).

In S132-4, the first residual generating unit 222 determines whether or not the mantissa value of the original data d'[i] is greater than or equal to the mantissa value of the data predicted value p'[i].

If the mantissa value of the original data d'[i] is greater than or equal to the mantissa value of the data predicted value p'[i] (YES), processing proceeds to S132-5.

If the mantissa value of the original data d'[i] is less than the mantissa value of the data predicted value p'[i] (NO), processing proceeds to S132-7.

In S132-5, the first residual generating unit 222 sets the sign value of the original data d'[i] in the sign part of the first residual r1[i].

After S132-5, processing proceeds to S132-6.

In S132-6, the first residual generating unit 222 sets a value obtained by subtracting the mantissa value of the data predicted value p'[i] from the mantissa value of the original data d'[i] (=the mantissa value of d'[i]–the mantissa value of p'[i]) in the mantissa part of the first residual r1[i].

S132-6 completes the sign value and mantissa value setting process (S132).

In S132-7, the first residual generating unit 222 sets the sign value of the data predicted value p'[i] in the sign part of the first residual r1[i].

After S132-7, processing proceeds to S132-8.

In S132-8, the first residual generating unit 222 sets a value obtained by subtracting the mantissa value of the original data d'[i] from the mantissa value of the data predicted value p'[i] (=the mantissa value of p'[i]–the mantissa value of d'[i]) in the mantissa part of the first residual r1[i].

S132-8 completes the sign value and mantissa value setting process (S132).

The sign value and mantissa value setting process (S132) of FIG. 7 is an example of a process for setting the sign value and the mantissa value of the first residual r1[i]. The first residual generating unit 222 may set the sign value and the mantissa value of the first residual r1[i] using a different process.

The first residual generating unit 222 may set the sign value and the mantissa value of the first residual r1[i] based on any one of the original data d'[i] and the data predicted value p'[i].

For example, the first residual generating unit 222 may set the sign value of the original data d'[i] in the sign part of the first residual r1[i], and set a value obtained by subtracting a predetermined value from (or adding a predetermined value to) the mantissa value of the original data d'[i] in the mantissa part of the first residual r1[i].

Referring back to FIG. 4, the data encoding process will be further described.

After S130, processing proceeds to S140.

In S140, the first residual predicted value generating unit 223 generates a predicted value of the first residual r1[i] based on the first residual history file 192. The predicted value of the first residual r1[i] is a floating-point value having the same data structure as the first residual r1[i].

Hereinafter, the predicted value of the first residual r1[i] will be described as a first residual predicted value p_r1[i].

For example, the first residual predicted value generating unit 223 obtains a previously generated first residual from the first residual history file 192, and sets the obtained first residual r1[i−1] in a variable of the first residual predicted value p_r1[i]. That is, p_r1[i]=r1 [i−1].

Note that the first residual predicted value generating unit 223 may use a value other than the first residual r1[i−1] as the first residual predicted value p_r1[i] (the same as in S110).

After S140, processing proceeds to S150.

In S150, the second residual generating unit 224 generates a residual between the first residual r1[i] and the first residual predicted value p_r1[i].

This process is mainly aimed at obtaining a residual between the exponent values which is not calculated when the first residual r1[i] is generated (S130).

Hereinafter, the residual between the first residual r1[i] and the first residual predicted value p_r1[i] will be described as a second residual r2[i]. The second residual r2[i] is a floating-point value having the same data structure as the first residual r1[i] and the first residual predicted value p_r1[i].

For example, the second residual generating unit 224 sets the sign value of the first residual r1[i] in the sign part of the second residual r2[i], sets the mantissa value of the first residual r1[i] in the mantissa part of the second residual r2[i], and sets a value obtained by subtracting the exponent value of the first residual predicted value p_r1[i] from the exponent value of the first residual r1[i] in the exponent part of the second residual r2[i].

Note that the second residual generating unit 224 may set values other than those described above in the sign part, the exponent part, and the mantissa part of the second residual r2[i].

For example, the second residual generating unit 224 may generate the sign part and the mantissa part of the second residual r2[i] as in the first residual generation process (S130)

described with reference to FIGS. 6 and 7, and may set a value obtained by subtracting the exponent value of the first residual predicted value p_r1[i] from the exponent value of the first residual r1[i] in the exponent part of the second residual r2[i]. In this case, in FIGS. 6 and 7, the second residual generating unit 224 may execute the process by replacing the first residual r1[i] with the second residual r2[i], replacing the original data d'[i] with the first residual r1[i], and replacing the data predicted value p'[i] with the first residual predicted value p_r1[i].

With this arrangement, the residual between the sign values and the residual between the mantissa values can be calculated in two steps (S130 and S150).

The second residual generating unit 224 may generate the second residual r2[i] based on any one of the first residual r1[i] and the first residual predicted value p_r1[i].

For example, the second residual generating unit 224 may set the sign value (or the opposite sign value) of the first residual predicted value p_r1[i] in the sign part of the second residual r2[i], set the exponent value (or a value obtained by adding or subtracting a predetermined value to or from the exponent value) of the first residual predicted value p_r1[i] in the exponent part of the second residual r2[i], and set the mantissa value (or a value obtained by adding or subtracting a predetermined value to or from the mantissa value) of the first residual predicted value p_r1[i] in the mantissa part of the second residual r2[i].

After S150, processing proceeds to S160.

In S160, the residual encoding unit 230 encodes the second residual r2[i] using a predetermined encoding process to generate encoded data 102, and outputs the generated encoded data 102.

For example, the residual encoding unit 230 encodes the second residual r2[i] using gamma encoding, delta encoding, Golomb-Rice encoding, or other variable-length encoding schemes. Alternatively, the residual encoding unit 230 may encode the second residual r2[i] by treating each of the sign part, the exponent part, and the mantissa part, or a combination of these parts as an individual integer value, as disclosed in Patent Literature 1 and Patent Literature 2.

The term "output" means to store in the data storage unit 190 or to output to an output device of the data compression apparatus 100.

S160 completes the data encoding process.

As described above, the data encoding unit 200 can resolve misalignment of the digits of the mantissa values due to a difference between the exponent values of the original data d[i] and the data predicted value p[i], without causing a loss of information of the original data d[i] (see S120).

Further, the data encoding unit 200 can generate the first residual r1[i] and the second residual r2[i] that reflect the floating-point data structure (see S130 and S150).

Then, the data encoding unit 200 can generate encoded data 102 by encoding the second residual r2[i] as described above (see S160). At this time, no additional information for identifying the modification method of the data predicted value p[i] in S120 is required. That is, the data encoding unit 200 can enhance the effect of compression obtained by encoding all the more because no additional information is required.

Figure 8:
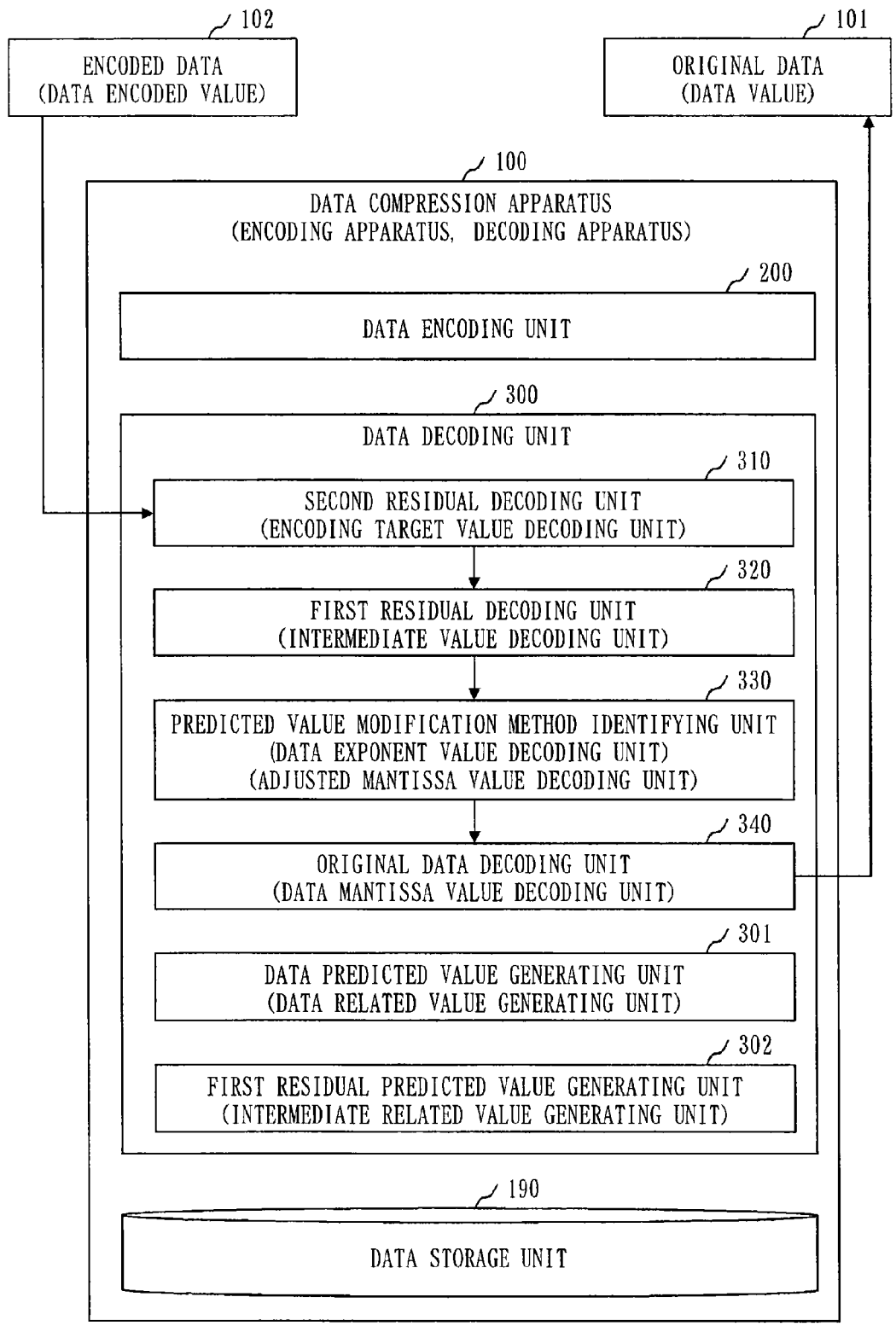
FIG. 8 is a diagram illustrating a functional configuration of a data decoding unit 300 according to the first embodiment.

FIG. 8 is a diagram illustrating a functional configuration of the data decoding unit 300 according to the first embodiment.

Referring to FIG. 8, the functional configuration of the data decoding unit 300 according to the first embodiment will be described.

The data decoding unit 300 includes a second residual decoding unit 310, a first residual decoding unit 320, a predicted value modification method identifying unit 330, an original data decoding unit 340, a data predicted value generating unit 301, and a first residual predicted value generating unit 302.

The second residual decoding unit 310 (an example of an encoding target value decoding unit) is configured to decode a second residual r2[i] from encoded data 102.

The second residual decoding unit 310 will be described in detail later.

The first residual decoding unit 320 (an example of an intermediate value decoding unit) is configured to generate a first residual r1[i] based on the second residual r2[i] and a first residual predicted value p_r1[i].

The first residual decoding unit 320 will be described in detail later.

The predicted value modification method identifying unit 330 (an example of a data exponent value decoding unit) is configured to generate an exponent value of original data d[i] based on an exponent value of the first residual r1[i].

The predicted value modification method identifying unit 330 (an example of an adjusted mantissa value decoding unit) is configured to generate a modified data predicted value p'[i] based on the exponent value of the original data d[i] and a data predicted value p[i].

The predicted value modification method identifying unit 330 will be described in detail later.

The original data decoding unit 340 (an example of a data mantissa value decoding unit) is configured to generate the original data d[i] (original data 101) based on the modified data predicted value p'[i] and the first residual r1[i].

The original data decoding unit 340 will be described in detail later.

The data predicted value generating unit 301 (an example of an adjusted mantissa value generating unit) has the same functional configuration as the data predicted value generating unit 210 of the data encoding unit 200 (see FIG. 3).

The first residual predicted value generating unit 302 (an example of an intermediate related value generating unit) has the same functional configuration as the first residual predicted value generating unit 223 of the data encoding unit 200 (see FIG. 3).

Figure 9:
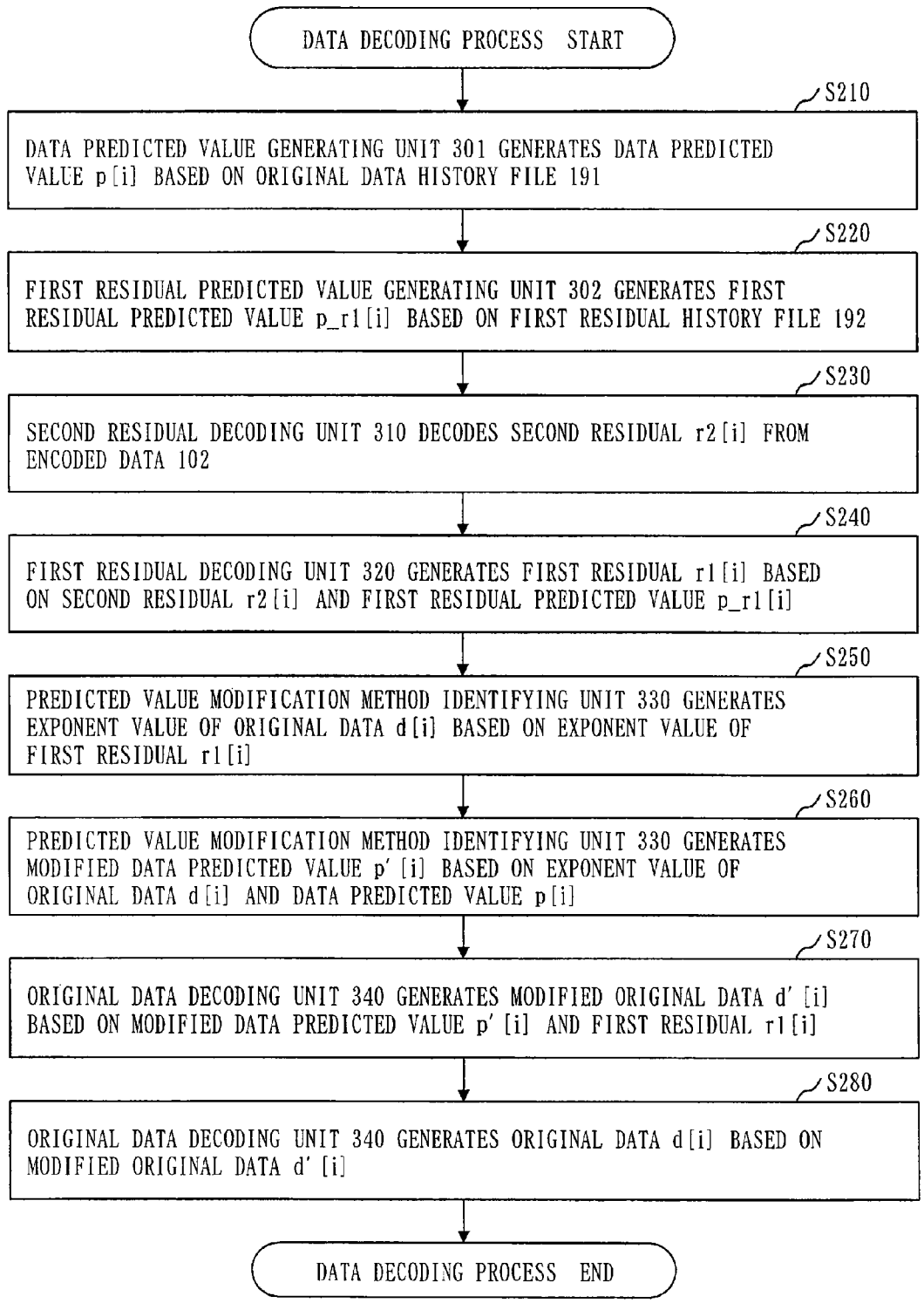
FIG. 9 is a flowchart illustrating a data decoding process of the data decoding unit 300 according to the first embodiment.

FIG. 9 is a flowchart illustrating a data decoding process of the data decoding unit 300 according to the first embodiment.

Referring to FIG. 9, the data decoding process (an example of a decoding method) of the data decoding unit 300 according to the first embodiment will be described.

In S210, the data predicted value generating unit 301 generates a data predicted value p[i] based on the original data history file 191.

A generation method of the data predicted value p[i] is the same as the generation method in S110 of the data encoding process (see FIG. 4).

After S210, processing proceeds to S220.

In S220, the first residual predicted value generating unit 302 generates a first residual predicted value p_r1[i] based on the first residual history file 192.

A generation method of the first residual predicted value p_r1[i] is the same as the generation method in S140 of the data encoding process (see FIG. 4).

After S220, processing proceeds to S230.

In S230, the second residual decoding unit 310 inputs encoded data 102 which is an encoded second residual r2[i], and executes a predetermined decoding process on the input encoded data 102 to decode a second residual r2[i].

Note that the decoding process that is executed by the second residual decoding unit 310 is a process corresponding to the encoding process that is executed in S160 of the data encoding process (see FIG. 4).

After S230, processing proceeds to S240.

In S240, the first residual decoding unit 320 generates a first residual r1[i] based on the second residual r2[i] and the first residual predicted value p_r1[i].

This first residual decoding process (S240) is a process corresponding to (a process of back-calculating) a second residual generation process (S150) of the data encoding process (see FIG. 4).

It is assumed, for example, that the second residual generation process (S150) is a process as described below.

(1) The sign value of the first residual r1[i] is set in the sign part of the second residual r2[i].

(2) The mantissa value of the first residual r1[i] is set in the mantissa part of the second residual r2[i].

(3) A value obtained by subtracting the exponent value of the first residual predicted value p_r1[i] from the exponent value of the first residual r1[i] is set in the exponent part of the second residual r2[i].

In this case, the first residual decoding unit 320 generates the first residual r1[i] by a process as described below.

(1) The sign value of the second residual r2[i] is set in the sign part of the first residual r1[i].

(2) The mantissa value of the second residual r2[i] is set in the mantissa part of the first residual r1[i].

(3) A value obtained by adding the exponent value of the first residual predicted value p_r1[i] to the exponent value of the second residual r2[i] is set in the exponent part of the first residual r1[i].

After S240, processing proceeds to S250.

In S250, the predicted value modification method identifying unit 330 generates an exponent value of original data d[i] based on the exponent value of the first residual r1[i].

This original data exponent value decoding process (S250) is a process corresponding to (a process of back-calculating) S131 of the first residual generation process (see FIG. 6).

In S131 of the first residual generation process (see FIG. 6), the exponent value of the first residual r1[i] is generated based on the exponent value of the original data d[i]. Thus, by using the back-calculating process, the exponent value of the original data d[i] can be generated based on the exponent value of the first residual r1[i].

For example, if S131 of the first residual generation process (see FIG. 6) is a process of setting the exponent value of the original data d'[i] (=the exponent value of the original data d[i]) in the exponent part of the first residual r[i], the exponent value of the original data d[i] is the same value as the exponent value of the first residual r1[i].

After S250, processing proceeds to S260.

In S260, the predicted value modification method identifying unit 330 generates a modified data predicted value p'[i] based on the exponent value of the original data d[i] and the data predicted value p[i].

A method for generating the modified data predicted value p'[i] is the same as S122 through S126 of the data predicted value modification process (see FIG. 5).

In S122 through S126 of the data predicted value modification process (see FIG. 5), the modified data predicted value p'[i] is generated based on the exponent value of the original data d[i] and the data predicted value p[i]. Thus, the modified data predicted value p'[i] can be generated without obtaining the sign value and the mantissa value of the original data d[i].

After S260, processing proceeds to S270.

In S270, the original data decoding unit 340 generates modified original data d'[i] based on the modified data predicted value p'[i] and the first residual r1[i].

This modified original data decoding process (S270) is a process corresponding to (a process of back-calculating) S132 of the first residual generation process (see FIG. 6).

Figure 10:
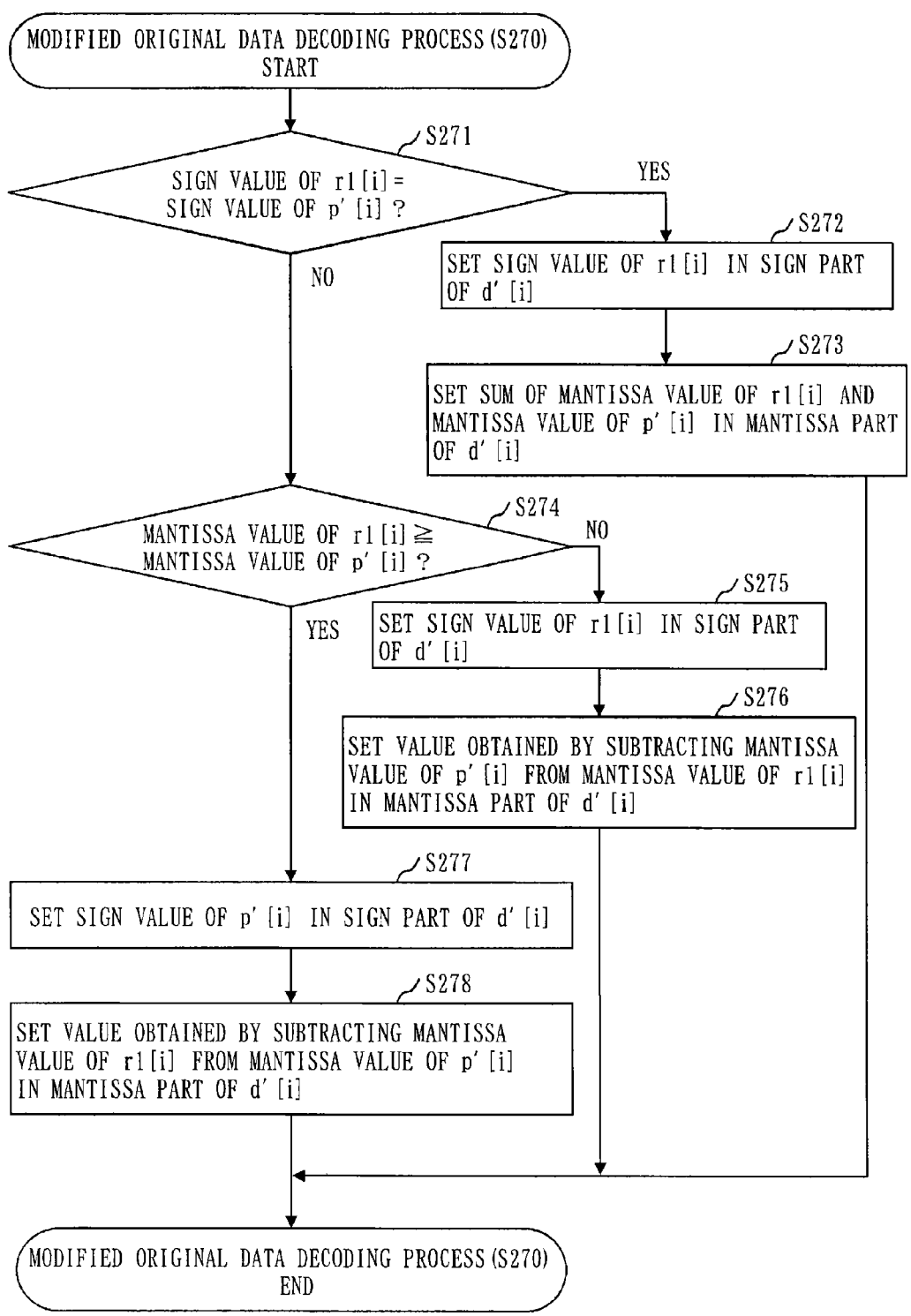
FIG. 10 is a diagram illustrating an example of a modified original data decoding process (S270) according to the first embodiment.

FIG. 10 is a diagram showing an example of the modified original data decoding process (S270) according to the first embodiment.

If S132 of the first residual generation process (see FIG. 6) is a process shown in FIG. 7, the original data decoding unit 340 generates the modified original data d'[i] by executing a process shown in FIG. 10.

In S271, the original data decoding unit 340 determines whether or not the sign value of the first residual r1[i] is the same as the sign value of the data predicted value p'[i].

If the sign value of the first residual r1[i] is the same as the sign value of the data predicted value p'[i] (YES), processing proceeds to S272.

If the sign value of the first residual r1[i] is different from the sign value of the data predicted value p'[i] (NO), processing proceeds to S274.

In S272, the original data decoding unit 340 sets the sign value of the first residual r1[i] in the sign part of the modified original data d'[i].

After S272, processing proceeds to S273.

In S273, the original data decoding unit 340 sets a sum of the mantissa value of the first residual r1[i] and the mantissa value of the data predicted value p'[i] in the mantissa part of the modified original data d'[i].

S273 completes the modified original data decoding process (S270).

In S274, the original data decoding unit 340 determines whether or not the mantissa value of the first residual r1[i] is greater than or equal to the mantissa value of the data predicted value p'[i].

If the mantissa value of the first residual r1[i] is greater than or equal to the mantissa value of the data predicted value p'[i] (YES), processing proceeds to S277.

If the mantissa value of the first residual r1[i] is less than the mantissa value of the data predicted value p'[i] (NO), processing proceeds to S275.

In S275, the original data decoding unit 340 sets the sign value of the first residual r1[i] in the sign part of the modified original data d'[i].

After S275, processing proceeds to S276.

In S276, the original data decoding unit 340 sets a value obtained by subtracting the mantissa value of the data predicted value p'[i] from the mantissa value of the first residual r1[i] in the mantissa part of the modified original data d'[i].

S276 completes the modified original data decoding process (S270).

In S277, the original data decoding unit 340 sets the sign value of the data predicted value p'[i] in the sign part of the modified original data d'[i].

After S277, processing proceeds to S278.

In S278, the original data decoding unit 340 sets a value obtained by subtracting the mantissa value of the data predicted value p'[i] from the mantissa value of the first residual r1[i] in the mantissa part of the modified original data d'[i].

S278 completes the modified original data decoding process (S270).

Referring back to FIG. 9, the data decoding process will be further described.

After S270, processing proceeds to S280.

In S280, the original data decoding unit 340 generates the original data d[i] based on the modified original data d'[i].

A method for generating the original data d[i] is a process corresponding to (a process of back-calculating) S121 of the data predicted value modification process (see FIG. 5).

For example, if S121 of the data predicted value modification process (see FIG. 5) is a process of adding an (N+2)-bit bit string to the most significant portion of the mantissa part of the original data d[i], the original data decoding unit 340 deletes the (N+2) most significant bits from the mantissa part of the modified original data d'[i]. In this case, the original data d[i] is data obtained by deleting the (N+2) most significant bits from the mantissa part of the original data d'[i].

S280 completes the data decoding process.

By the data decoding process, the data decoding unit 300 can properly decode the original data 101 from the encoded data 102.

The data compression apparatus 100 described above is configured to generate encoded data 102 using the data predicted value modifying unit 221, the first residual generating unit 222, and the second residual generating unit 224, thereby realizing both reflection of the data structure of the original data 101 (floating-point) and lossless compression of the original data 101.

By eliminating the need for additional information regarding the modification method of the data predicted value p'[i], the data compression apparatus 100 realizes a high encoding compressibility.

It is assumed that procedures and rules of the data encoding process (including the modification method of the data predicted value p[i] (see FIG. 5)) are predetermined and stored in the data encoding unit 200.

It is assumed that procedures and rules of the data decoding process corresponding to the data encoding process are predetermined and stored in the data decoding unit 300.

The data encoding unit 200 and the data decoding unit 300 may be included in separate apparatuses. That is, the data compression apparatus 100 may be replaced with a data encoding apparatus including the data encoding unit 200 and a data decoding apparatus including the data decoding unit 300.

In this case, information necessary for both of the data encoding unit 200 and the data decoding unit 300 (for example, the original data history file 191 and the first residual history file 192) is stored in each apparatus.

Figure 11:
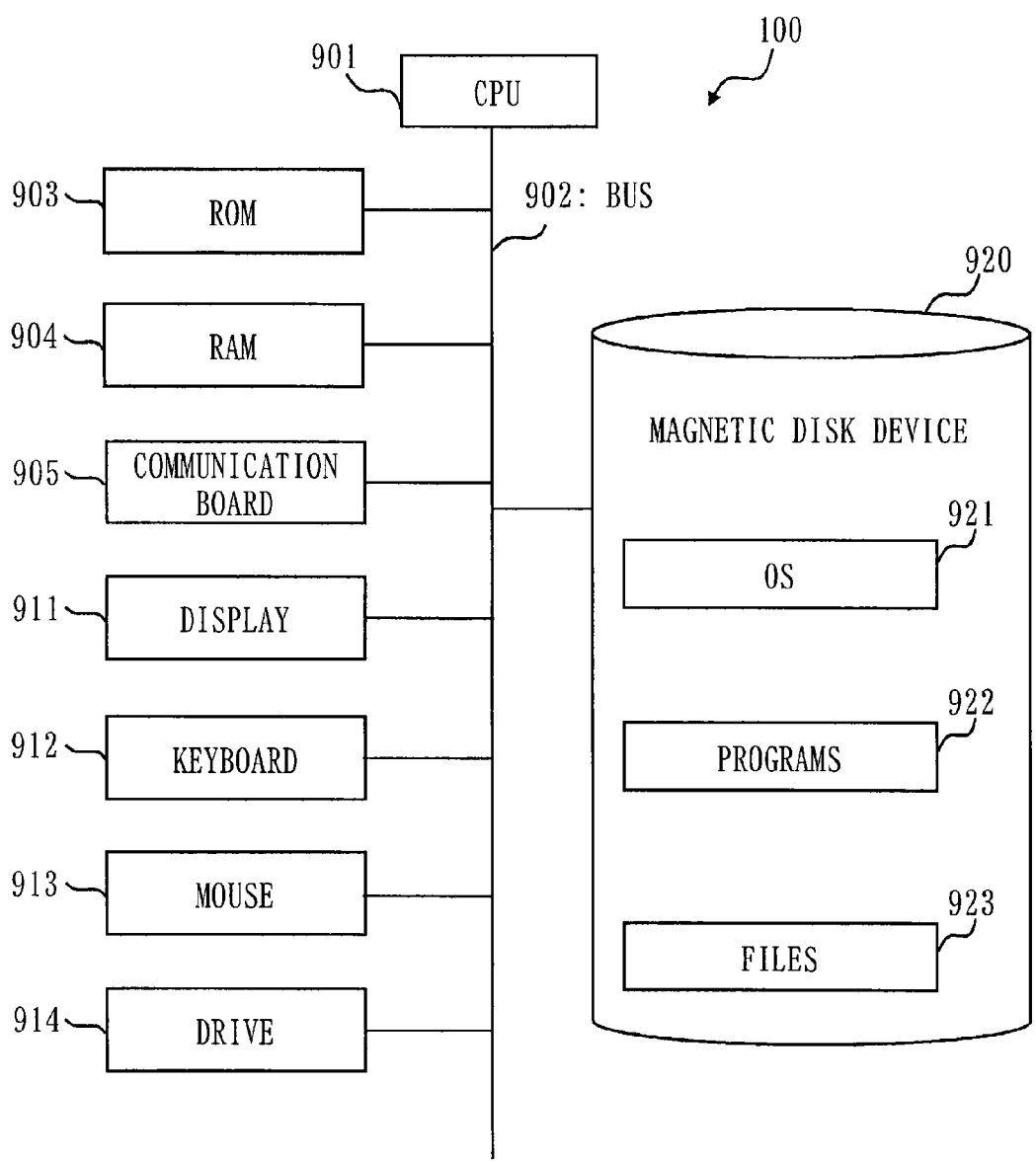
FIG. 11 is a diagram illustrating an example of hardware resources of the data compression apparatus 100 according to the first embodiment.

FIG. 11 is a diagram illustrating an example of hardware resources of the data compression apparatus 100 according to the first embodiment.

Referring to FIG. 11, the data compression apparatus 100 (an example of a computer) includes a CPU 901 (Central Processing Unit). The CPU 901 is connected via a bus 902 to hardware devices, such as a ROM 903, a RAM 904, a communication board 905 (communication device), a display 911 (display device), a keyboard 912, a mouse 913, a drive 914, and a magnetic disk device 920, and controls these hardware devices. The drive 914 is a device configured to read from and write to a storage medium, such as an FD (Flexible Disk), a CD (Compact Disc), and a DVD (Digital Versatile Disc).

The ROM 903, the RAM 904, the magnetic disk device 920, and the drive 914 are examples of a storage device. The keyboard 912, the mouse 913, and the communication board 905 are examples of an input device. The display 911 and the communication board 905 are examples of an output device.

The communication board 905 is connected to a communication network, such as a LAN (Local Area Network), the Internet, and a telephone line, in a wired or wireless fashion.

The magnetic disk device 920 stores an OS 921 (operating system), programs 922, and files 923.

The programs 922 include programs for executing functions that are described as "units" in the embodiment. The programs (for example, an encoding program and a decoding program) are read out and executed by the CPU 901. That is, each program causes the computer to function as each "unit", or causes the computer to execute a procedure or a method of each "unit".

The files 923 include various data (input, output, result of determination, result of computation, result of processing, etc.) used in each "unit" described in the embodiment.

In the embodiment, an arrow included in a configuration diagram or a flowchart mainly denotes an input/output of data or a signal.

Each process described in the embodiment based on a flowchart or the like is executed using hardware, such as the CPU 901, the storage device, the input device, and the output device.

In the embodiment, what is described as a "unit" may be a "circuit", "device", or "equipment", and may also be a "step", "procedure" or "process". That is, what is described as a "unit" may be implemented by firmware, software, or hardware, or may be implemented by a combination of these.

In the first embodiment, an encoding apparatus (data encoding unit 200 of the data compression apparatus 100) such as below, for example, has been described. The names used in the first embodiment are indicated in parentheses.

The encoding apparatus includes a data value storage unit, a data related value storage unit, an adjusted mantissa value generating unit, an encoding target value generating unit, and a data encoded value generating unit.

The data value storage unit (data storage unit 190) is a storage unit configured to store a data value (original data 101), the data value being a floating-point value represented using an exponent value and a mantissa value, and being a value intended to be encoded.

The data related value storage unit (data storage unit 190) is a storage unit configured to store a data related value (data predicted value p[i]), the data related value being a floating-point value used for encoding the data value stored in the data value storage unit.

The adjusted mantissa value generating unit (data predicted value modifying unit 221) is configured to generate an adjusted mantissa value (mantissa value of the data predicted value p'[i]) by adjusting a mantissa value of the data related value based on a difference between an exponent value of the data related value stored in the data related value storage unit and the exponent value of the data value stored in the data value storage unit.

The encoding target value generating unit (residual generating unit 220) is configured to generate a specific exponent value based on the exponent value of the data value stored in the data value storage unit. The encoding target value generating unit is configured to generate a specific mantissa value based on the mantissa value of the data value and the adjusted mantissa value generated by the adjusted mantissa value generating unit. The encoding target value generating unit is configured to generate an encoding target value (second residual r2[i]) based on the specific exponent value and the specific mantissa value, the encoding target value being a floating-point value and being a value to be encoded.

The data encoded value generating unit (residual encoding unit 230) is configured to generate a data encoded value (encoded data 102) by encoding the encoding target value generated by the encoding target value generating unit.

The adjusted mantissa value generating unit is configured to calculate, as the adjusted mantissa value, a changed mantissa value of the data related value in a case where the exponent value of the data related value is changed to a same value as the exponent value of the data value and where the mantissa value of the data related value is changed such that a number of digits of the data related value is not changed by changing the exponent value of the data related value (see S123 and S125 in FIG. 5).

The adjusted mantissa value generating unit is configured to add a predetermined number (parameter N) of additional digits as most significant digits to a mantissa part that represents the mantissa value of the data related value by one or more digits (see S121 in FIG. 5).

In a case where the exponent value of the data related value is less than or equal to the exponent value of the data value, the adjusted mantissa value generating unit is configured to shift the mantissa value of the data related value to a least significant side by a number of digits corresponding to an exponent value difference between the exponent value of the data related value and the exponent value of the data value (see S123 in FIG. 5).

In a case where the exponent value of the data related value is greater than the exponent value of the data value and where the exponent value difference is less than or equal to the number of additional digits, the adjusted mantissa value generating unit is configured to shift the mantissa value of the data related value to a most significant side by the number of digits corresponding to the exponent value difference (see S125 in FIG. 5).

In a case where the exponent value of the data related value is greater than the exponent value of the data value and where the exponent value difference is greater than the number of additional digits, the adjusted mantissa value generating unit is configured to set a predetermined dummy value in the mantissa part of the data related value (see S126 in FIG. 5).

The encoding target value generating unit is configured to generate, as the specific exponent value, a same exponent value as the exponent value of the data value (see S131 in FIG. 6).

The encoding target value generating unit is configured to generate, as the specific mantissa value, any one of a value of a sum of the mantissa value of the data value and the adjusted mantissa value, and a value of a difference between the mantissa value of the data value and the adjusted mantissa value (see S132-3, S132-6, and S132-8 in FIG. 7).

The encoding apparatus includes an intermediate related value storage unit (data storage unit 190) configured to store an intermediate related value (first residual predicted value p_r1[i]) which is a specific floating-point value.

The encoding target value generating unit is configured to generate an intermediate value (first residual r1[i]) which is a floating-point value by using the specific exponent value and the specific mantissa value, and generate the encoding target value (second residual r2[i]) based on the intermediate value and the intermediate related value stored in the intermediate related value storage unit.

The encoding target value generating unit is configured to generate the encoding target value by using a value of a difference between an exponent value of the intermediate value and an exponent value of the intermediate related value as an exponent value of the encoding target value, and by using a same mantissa value as a mantissa value of the intermediate value as a mantissa value of the encoding target value (see S150 in FIG. 4).

The encoding apparatus further includes a previous intermediate value storage unit and an intermediate related value generating unit.

The previous intermediate value storage unit (first residual history file 192 of the data storage unit 190) is a storage unit configured to store one or more previously generated intermediate values as previous intermediate values.

The intermediate related value generating unit (first residual predicted value generating unit 223) is configured to generate the intermediate related value (first residual predicted value p_r1[i]) based on at least any one of the previous intermediate values stored in the previous intermediate value storage unit.

The encoding apparatus further includes a previous data value storage unit and a data related value generating unit.

The previous data value storage unit (original data history file 191 of the data storage unit 190) is a storage unit configured to store one or more previously encoded data values as previous data values.

The data related value generating unit (data predicted value generating unit 210) is configured to generate the data related value (data predicted value p[i]) based on at least any one of the previous data values stored in the previous data value storage unit.

In the first embodiment, a decoding apparatus (data compression apparatus 100) such as below, for example, has been described. The names used in the first embodiment are indicated in parentheses.

The decoding apparatus includes a data encoded value storage unit, a data related value storage unit, an encoding target value decoding unit, a data exponent value decoding unit, an adjusted mantissa value decoding unit, and a data mantissa value decoding unit.

The data encoded value storage unit (data storage unit 190) is a storage unit configured to store a data encoded value (encoded data 102), the data encoded value being a floating-point value represented using an exponent value and a mantissa value and being an encoded value.

The data related value storage unit (data storage unit 190) is a storage unit configured to store a data related value (data predicted value p[i]), the data related value being a floating-point value used for obtaining a data value (original data 101) intended to be decoded.

The encoding target value decoding unit (second residual decoding unit 310) is configured to generate an encoding target value (second residual r2[i]) which is a floating-point value by decoding the data encoded value stored in the data encoded value storage unit.

The data exponent value decoding unit (predicted value modification method identifying unit 330) is configured to generate an exponent value of the data value based on an exponent value of the encoding target value generated by the encoding target value decoding unit.

The adjusted mantissa value decoding unit (predicted value modification method identifying unit 330) is configured to generate an adjusted mantissa value (mantissa value of the data predicted value p[i]) by adjusting a mantissa value of the data related value based on a difference between the exponent value of the data value generated by the data exponent value decoding unit and an exponent value of the data related value stored in the data related value storage unit.

The data mantissa value decoding unit (original data decoding unit 340) is configured to generate a mantissa value of the data value based on the adjusted mantissa part generated by the adjusted mantissa value decoding unit and a mantissa value of the encoding target value generated by the encoding target value decoding unit.

REFERENCE SIGNS LIST

100: data compression device, 101: original data, 102: encoded data, 190: data storage unit, 191: original data history file, 192: first residual history file, 200: data encoding unit, 210: data predicted value generating unit, 220: residual generating unit, 221: data predicted value modifying unit, 222: first residual generating unit, 223: first residual predicted value generating unit, 224: second residual generating unit, 230: residual encoding unit, 300: data decoding unit, 301: data predicted value generating unit, 302: first residual predicted value generating unit, 310: second residual decoding unit, 320: first residual decoding unit, 330: predicted value modification method identifying unit, 340: original data decoding unit, 901: CPU, 902: bus, 903: ROM, 904: RAM, 905: communication board, 911: display, 912: keyboard, 913: mouse, 914: drive, 920: magnetic disk device, 921: OS, 922: programs, 923: files

The invention claimed is:

1. An encoding apparatus comprising:
a data value storage unit configured to store a data value, the data value being a floating-point value represented using an exponent value and a mantissa value, and being a value intended to be encoded;
a data related value storage unit configured to store a data related value, the data related value being a floating-point value used for encoding the data value stored in the data value storage unit;
an adjusted mantissa value generating unit configured to generate an adjusted mantissa value by adjusting a mantissa value of the data related value based on a difference between an exponent value of the data related value stored in the data related value storage unit and the exponent value of the data value stored in the data value storage unit;
an encoding target value generating unit configured to generate a specific exponent value based on the exponent value of the data value stored in the data value storage unit, generate a specific mantissa value based on the mantissa value of the data value and the adjusted mantissa value generated by the adjusted mantissa value generating unit, and generate an encoding target value based on the specific exponent value and the specific mantissa value, the encoding target value being a floating-point value and being a value to be encoded; and
a data encoded value generating unit configured to generate a data encoded value by encoding the encoding target value generated by the encoding target value generating unit,
wherein the adjusted mantissa value generating unit is configured to add additional digits as most significant digits to a mantissa part that represents the mantissa value of the data related value by one or more digits, and
in a case where the exponent value of the data related value is less than or equal to the exponent value of the data value, the adjusted mantissa value generating unit is configured to shift the mantissa value of the data related value to a least significant side by a number of digits corresponding to an exponent value difference between the exponent value of the data related value and the exponent value of the data value, and
in a case where the exponent value of the data related value is greater than the exponent value of the data value and where the exponent value difference is less than or equal to a number of the additional digits, the adjusted mantissa value generating unit is configured to shift the mantissa value of the data related value to a most significant side by the number of digits corresponding to the exponent value difference, and
in a case where the exponent value of the data related value is greater than the exponent value of the data value and where the exponent value difference is greater than the number of the additional digits, the adjusted mantissa value generating unit is configured to set a dummy value in the mantissa part of the data related value.

2. The encoding apparatus according to claim 1,
wherein the adjusted mantissa value generating unit is configured to calculate, as the adjusted mantissa value, a changed mantissa value of the data related value in a case where the exponent value of the data related value is changed to a same value as the exponent value of the data value and where the mantissa value of the data related value is changed such that a number of digits of the data related value is not changed by changing the exponent value of the data related value.

3. The encoding apparatus according to claim 1,
wherein the encoding target value generating unit is configured to generate, as the specific exponent value, a same exponent value as the exponent value of the data value.

4. The encoding apparatus according claim 1,
wherein the encoding target value generating unit is configured to generate, as the specific mantissa value, any one of a value of a sum of the mantissa value of the data value and the adjusted mantissa value, and a value of a difference between the mantissa value of the data value and the adjusted mantissa value.

5. The encoding apparatus according to claim 1, further comprising:
an intermediate related value storage unit configured to store an intermediate related value which is a specific floating-point value,
wherein the encoding target value generating unit is configured to generate an intermediate value which is a floating-point value by using the specific exponent value and the specific mantissa value, and generate the encoding target value based on the intermediate value and the intermediate related value stored in the intermediate related value storage unit.

6. The encoding apparatus according to claim 5,
wherein the encoding target value generating unit is configured to generate the encoding target value by using a value of a difference between an exponent value of the intermediate value and an exponent value of the intermediate related value as an exponent value of the encoding target value, and by using a same mantissa value as a mantissa value of the intermediate value as a mantissa value of the encoding target value.

7. The encoding apparatus according to claim 1, further comprising:
a previous intermediate value storage unit configured to store one or more previously generated intermediate values as previous intermediate values; and
an intermediate related value generating unit configured to generate the intermediate related value based on at least any one of the previous intermediate values stored in the previous intermediate value storage unit.

8. The encoding apparatus according to claim 1, further comprising:
a previous data value storage unit configured to store one or more previously encoded data values as previous data values; and a data related value generating unit configured to generate the data related value based on at least any one of the previous data values stored in the previous data value storage unit.

9. A decoding apparatus comprising:
a data encoded value storage unit configured to store a data encoded value, the data encoded value being a floating-point value represented using an exponent value and a mantissa value and being an encoded value;
a data related value storage unit configured to store a data related value, the data related value being a floating-point value used for obtaining a data value intended to be decoded;
an encoding target value decoding unit configured to generate an encoding target value which is a floating-point value by decoding the data encoded value stored in the data encoded value storage unit;
a data exponent value decoding unit configured to generate an exponent value of the data value based on an exponent value of the encoding target value generated by the encoding target value decoding unit;
an adjusted mantissa value decoding unit configured to generate an adjusted mantissa value by adjusting a mantissa value of the data related value based on a difference between the exponent value of the data value generated by the data exponent value decoding unit and an exponent value of the data related value stored in the data related value storage unit; and
a data mantissa value decoding unit configured to generate a mantissa value of the data value based on the adjusted mantissa value generated by the adjusted mantissa value decoding unit and a mantissa value of the encoding target value generated by the encoding target value decoding unit,
wherein in a case where the exponent value of the data related value is less than or equal to the exponent value of the data value, the adjusted mantissa value decoding unit is configured to shift the mantissa value of the data related value to a least significant side by a number of digits corresponding to an exponent value difference between the exponent value of the data related value and the exponent value of the data value, and
in a case where the exponent value of the data related value is greater than the exponent value of the data value and where the exponent value difference is less than or equal to a number of additional digits that are added as most significant digits to a mantissa part that represents the mantissa value of the data related value by one or more digits, the adjusted mantissa value decoding unit is configured to shift the mantissa value of the data related value to a most significant side by the number of digits corresponding to the exponent value difference, and
in a case where the exponent value of the data related value is greater than the exponent value of the data value and where the exponent value difference is greater than the number of the additional digits, the adjusted mantissa value decoding unit is configured to set a dummy value in the mantissa part of the data related value.

10. An encoding method using an encoding apparatus including a data value storage unit, a data related value storage unit, an adjusted mantissa value generating unit, an encoding target value generating unit, and a data encoded value generating unit,
the data value storage unit being a storage unit configured to store a data value, the data value being a floating-point value represented using an exponent value and a mantissa value and being a value intended to be encoded,
the data related value storage unit being a storage unit configured to store a data related value, the data related value being a floating-point value used for encoding the data value stored in the data value storage unit,
the encoding method comprising:
generating, by the adjusted mantissa value generating unit, an adjusted mantissa value by adjusting a mantissa value of the data related value based on a difference between an exponent value of the data related value stored in the data related value storage unit and the exponent value of the data value stored in the data value storage unit;
generating a specific exponent value based on the exponent value of the data value stored in the data value storage unit, generating a specific mantissa value based on the mantissa value of the data value and the adjusted mantissa value generated by the adjusted mantissa value generating unit, and generating an encoding target value based on the specific exponent value and the specific mantissa value, the encoding target value being a floating-point value and being a value to be encoded, by the encoding target value generating unit; and
generating, by the data encoded value generating unit, a data encoded value by encoding the encoding target value generated by the encoding target value generating unit,
wherein, in order to generate the adjusted mantissa value, the adjusted mantissa value generating unit is configured to add additional digits as most significant digits to a mantissa part that represents the mantissa value of the data related value by one or more digits, and
in a case where the exponent value of the data related value is less than or equal to the exponent value of the data value, the adjusted mantissa value generating unit is configured to shift the mantissa value of the data related value to a least significant side by a number of digits corresponding to an exponent value difference between the exponent value of the data related value and the exponent value of the data value, and
in a case where the exponent value of the data related value is greater than the exponent value of the data value and where the exponent value difference is less than or equal to a number of the additional digits, the adjusted mantissa value generating unit is configured to shift the mantissa value of the data related value to a most significant side by the number of digits corresponding to the exponent value difference, and
in a case where the exponent value of the data related value is greater than the exponent value of the data value and where the exponent value difference is greater than the number of the additional digits, the adjusted mantissa value generating unit is configured to set a dummy value in the mantissa part of the data related value.

11. An encoding program using a data value and a data related value,
the data value being a floating-point value represented using an exponent value and a mantissa value and being a value intended to be encoded,
the data related value being a floating-point value used for encoding the data value,
the encoding program causing a computer to execute
an adjusted mantissa value generation process of generating an adjusted mantissa value by adjusting a mantissa value of the data related value based on a difference between an exponent value of the data related value and the exponent value of the data value;
an encoding target value generation process of generating a specific exponent value based on the exponent value of the data value, generating a specific mantissa value based on the mantissa value of the data value and the adjusted mantissa value, and generating an encoding target value based on the specific exponent value and the specific mantissa value, the encoding target value being a floating-point value and being a value to be encoded; and a data encoded value generation process of generating a data encoded value by encoding the encoding target value, wherein, in order to generate the adjusted mantissa value, the adjusted mantissa value generation process is configured to add additional digits as most significant digits to a mantissa part that represents the mantissa value of the data related value by one or more digits, and in a case where the exponent value of the data related value is less than or equal to the exponent value of the data value, the adjusted mantissa value generation process is configured to shift the mantissa value of the data related value to a least significant side by a number of digits corresponding to an exponent value difference between the exponent value of the data related value and the exponent value of the data value, and in a case where the exponent value of the data related value is greater than the exponent value of the data value and where the exponent value difference is less than or equal to a number of the additional digits, the adjusted mantissa value generation process is configured to shift the mantissa value of the data related value to a most significant side by the number of digits corresponding to the exponent value difference, and in a case where the exponent value of the data related value is greater than the exponent value of the data value and where the exponent value difference is greater than the number of the additional digits, the adjusted mantissa value generation process is configured to set a dummy value in the mantissa part of the data related value.

12. A decoding method using a decoding apparatus including a data encoded value storage unit, a data related value storage unit, an encoding target value decoding unit, a data exponent value decoding unit, an adjusted mantissa value decoding unit, and a data mantissa value decoding unit, the data encoded value storage unit being a storage unit configured to store a data encoded value, the data encoded value being a floating-point value represented using an exponent value and a mantissa value and being an encoded value, the data related value storage unit being a storage unit configured to store a data related value, the data related value being a floating-point value used for obtaining a data value intended to be decoded, the decoding method comprising:

generating, by the encoding target value decoding unit, an encoding target value which is a floating-point value by decoding the data encoded value stored in the data encoded value storage unit;

generating, by the data exponent value decoding unit, an exponent value of the data value based on an exponent value of the encoding target value generated by the encoding target value decoding unit;

generating, by the adjusted mantissa value decoding unit, an adjusted mantissa value by adjusting a mantissa value of the data related value based on a difference between the exponent value of the data value generated by the data exponent value decoding unit and an exponent value of the data related value stored in the data related value storage unit; and generating, by the data mantissa value decoding unit, a mantissa value of the data value based on the adjusted mantissa value generated by the adjusted mantissa value decoding unit and a mantissa value of the encoding target value generated by the encoding target value decoding unit, wherein in order to generate the adjusted mantissa value, in a case where the exponent value of the data related value is less than or equal to the exponent value of the data value, the adjusted mantissa value decoding unit is configured to shift the mantissa value of the data related value to a least significant side by a number of digits corresponding to an exponent value difference between the exponent value of the data related value and the exponent value of the data value, and in a case where the exponent value of the data related value is greater than the exponent value of the data value and where the exponent value difference is less than or equal to a number of additional digits that are added as most significant digits to a mantissa part that represents the mantissa value of the data related value by one or more digits, the adjusted mantissa value decoding unit is configured to shift the mantissa value of the data related value to a most significant side by the number of digits corresponding to the exponent value difference, and in a case where the exponent value of the data related value is greater than the exponent value of the data value and where the exponent value difference is greater than the number of the additional digits, the adjusted mantissa value decoding unit is configured to set a dummy value in the mantissa part of the data related value.

13. A decoding program using a data encoded value and a data related value, the data encoded value being a floating-point value represented using an exponent value and a mantissa value and being an encoded value, the data related value being a floating-point value used for obtaining a data value intended to be decoded, the decoding program causing a computer to execute an encoding target value decoding process of generating an encoding target value which is a floating-point value by decoding the data encoded value;

a data exponent value decoding process of generating an exponent value of the data value based on an exponent value of the encoding target value;

an adjusted mantissa value decoding process of generating an adjusted mantissa value by adjusting a mantissa value of the data related value based on a difference between the exponent value of the data value and an exponent value of the data related value; and a data mantissa value decoding process of generating a mantissa value of the data value based on the adjusted mantissa value and a mantissa value of the encoding target value, wherein in order to generate the adjusted mantissa value, in a case where the exponent value of the data related value is less than or equal to the exponent value of the data value, the adjusted mantissa value decoding process is configured to shift the mantissa value of the data related value to a least significant side by a number of digits corresponding to an exponent value difference between the exponent value of the data related value and the exponent value of the data value, and in a case where the exponent value of the data related value is greater than the exponent value of the data value and where the exponent value difference is less than or equal to a number of additional digits that are added as most significant digits to a mantissa part that represents the mantissa value of the data related value by one or more digits, the adjusted mantissa value decoding process is configured to shift the mantissa value of the data related value to a most significant side by the number of digits corresponding to the exponent value difference, and in a case where the exponent value of the data related value is greater than the exponent value of the data value and where the exponent value difference is greater than the number of the additional digits, the adjusted mantissa value decoding process is configured to set a dummy value in the mantissa part of the data related value.

* * * * *